US012025582B2

(12) United States Patent
Yoo et al.

(10) Patent No.: US 12,025,582 B2
(45) Date of Patent: Jul. 2, 2024

(54) FLOATING GATE SEMICONDUCTOR NANOSTRUCTURE-BASED BIOSENSOR AND METHOD FOR MANUFACTURING SAME

(71) Applicant: OSONG MEDICAL INNOVATION FOUNDATION, Cheongju-si (KR)

(72) Inventors: Sung-Keun Yoo, Sejong-si (KR); Seung-Wan Seo, Seoul (KR); Jeong-A Kim, Cheongju-si (KR); Dong-Jun Moon, Cheongju-si (KR)

(73) Assignee: OSONG MEDICAL INNOVATION FOUNDATION, Cheongju-si (KR)

( * ) Notice: Subject to any disclaimer, the term of this patent is extended or adjusted under 35 U.S.C. 154(b) by 52 days.

(21) Appl. No.: 17/892,323

(22) Filed: Aug. 22, 2022

(65) Prior Publication Data
US 2022/0397547 A1    Dec. 15, 2022

Related U.S. Application Data

(62) Division of application No. 16/498,380, filed as application No. PCT/KR2018/003745 on Mar. 29, 2018, now Pat. No. 11,460,433.

(30) Foreign Application Priority Data

Mar. 29, 2017  (KR) .......................... 10-2017-0039922

(51) Int. Cl.
*G01N 27/414* (2006.01)
*B82Y 10/00* (2011.01)
(Continued)

(52) U.S. Cl.
CPC .......... *G01N 27/4146* (2013.01); *B82Y 10/00* (2013.01); *G01N 27/4145* (2013.01); *H01L 29/068* (2013.01); *H01L 29/42324* (2013.01)

(58) Field of Classification Search
CPC .......... G01N 27/4146; G01N 27/4145; G01N 27/327; B82Y 10/00; H01L 29/068; H01L 29/42324
See application file for complete search history.

(56) References Cited

U.S. PATENT DOCUMENTS

2008/0063566 A1\*  3/2008  Matsumoto ........ G01N 27/4146
                                                                    422/50
2012/0267693 A1   10/2012  Homl-Kennedy

FOREIGN PATENT DOCUMENTS

JP         2009-002939 A    1/2009
KR    10-2006-0036487 A    4/2006
(Continued)

OTHER PUBLICATIONS

EPO office action issued on Dec. 22, 2022.
International search report issued on Jun. 25, 2018.

*Primary Examiner* — Suberr L Chi
(74) *Attorney, Agent, or Firm* — LEEPI

(57) ABSTRACT

In a floating gate semiconductor nanostructure biosensor and a method for manufacturing the biosensor, the nanostructure biosensor includes a substrate, an insulating layer, a nanostructure, a source electrode and a drain electrode, a floating gate and a biological sensing material. The insulating layer is formed on the substrate. The nanostructure is protruded from the insulating layer. The source electrode and the drain electrode are formed on the insulating layer and dispose the nanostructure therebetween. The floating gate has a metal pattern or a polysilicon pattern, and extends with contacting the nanostructure. The biological sensing material has a first end combined with an immobile molecule on the floating gate, and a second end combined with a bio molecule.

5 Claims, 17 Drawing Sheets

(51) Int. Cl.
*H01L 29/06* (2006.01)
*H01L 29/423* (2006.01)

(56) References Cited

FOREIGN PATENT DOCUMENTS

| | | |
|---|---|---|
| KR | 10-2006-0115470 A | 11/2006 |
| KR | 10-2010-0028994 A | 3/2010 |
| KR | 10-2013-0036484 A | 4/2013 |
| WO | 2015/088055 A1 | 6/2015 |

\* cited by examiner

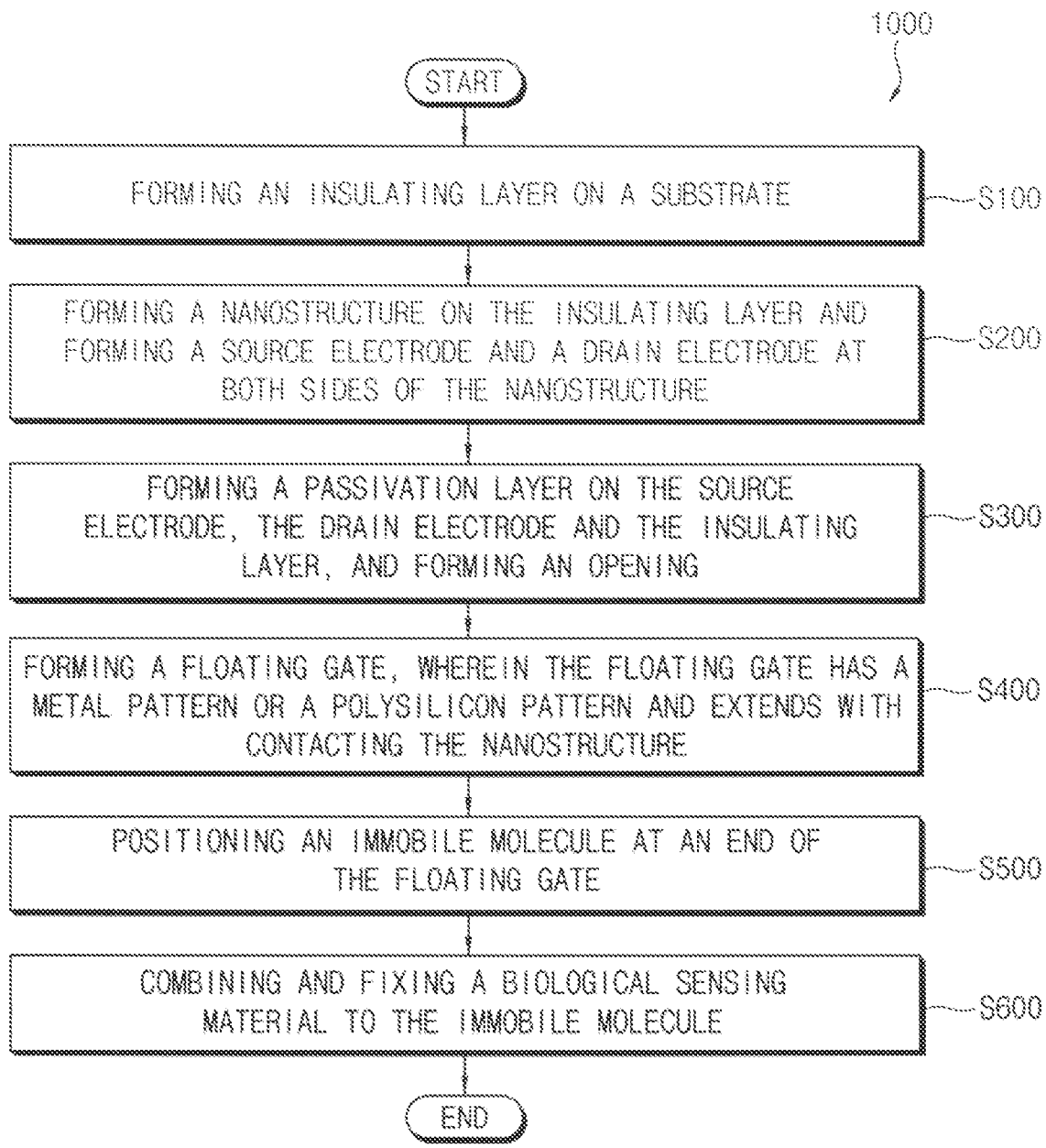

FLOATING GATE SEMICONDUCTOR NANOSTRUCTURE-BASED BIOSENSOR AND METHOD FOR MANUFACTURING SAME

BACKGROUND

1. Field of Disclosure

The present disclosure of invention relates to a floating gate semiconductor nanostructure biosensor and a method for manufacturing the biosensor, and more specifically the present disclosure of invention relates to a floating gate semiconductor nanostructure biosensor and a method for manufacturing the biosensor, used for medical fields such as diagnosis of a disease like a cancer, fermentation industry, food industry, agriculture industry, environmental industry and so on.

2. Description of Related Technology

A semiconductor nanostructure such as semiconductor nanoline, nanowire, nanoribbon having one-dimensional structure, has excellent electrical, optical, physical characteristics, and thus recently, the semiconductor nanostructure has been developed to be used for various kinds of fields.

Compared to a carbon nanotube, the semiconductor nanostructure has merits to be easily controlled and may be manufactured with mass production, since the semiconductor nanostructure is manufactured by a conventional manufacturing process for the semiconductor.

Further, the semiconductor nanostructure is known to be highly sensitive for a bio-sensing, and thus the semiconductor nanostructure comes into the limelight.

In a semiconductor nanostructure biosensor, a biological detection material reacted to a target material (chemical factor, bio molecule, disease marker) is fixed on a surface of a nanostructure with immobilized molecules, and when the fixed biological detection material is combined with the target material, electrical properties of the nanostructure is changed like field effect transistor (FET) effect, and thus a change of conductivity or a change of threshold voltage may be detected.

In the nanostructure, a surface area with respect to a volume is very large such that a reaction with an electrically charged bio molecule highly affects conduction characteristics of the entire nanostructure, and thus, the semiconductor nanostructure has high sensitivity. Accordingly, the nanostructure in itself is very sensitive due to confinement, but physically and chemically limitation exists between the surface of the nanostructure and a solution. Thus, the surface area of the nanostructure is very small compared to a conventional biosensor, and thus reproducibility of the nanostructure in the sensitivity is limited when the nanostructure is fabricated as the biosensor.

Recently, to increase the reproducibility, studies for increasing a sensing surface have been reported. For example, several numbers of silicon nanostructures may be integrated with high density, but increasing the length of channel of the several numbers of the silicon nanostructures to dozens or hundreds of micrometers is impossible. As the length of the channel increases, processing time also increases for patterning the nanostructure using electron beam lithography. In addition, as the number of the nanostructures increase, a width of an effective channel also increase and thus the sensitivity decreases.

As another example to increase the sensing surface, using a vertical nanostructure is provided. In the vertical nanostructure, the nanostructure is vertically grown using a bottom-up method, and an electrode is formed on the grown nanostructure. The vertical nanostructure may have an enlarged sensing surface, but the vertical nanostructure normally used inside of a liquid is hard to be insulated. Thus, the vertical nanostructure is merely used for a gas state.

Accordingly, in the conventional semiconductor nanostructure biosensor, a probe molecule is directly coated and fixed on the nanostructure in itself, and is exposed to a liquid for the sensing, and thus combination probability of the biomolecule is relatively low and the reproducibility is also very low. Further, the nanostructure is directly exposed to outside, and thus the biosensor is very sensitive to the change of environmental conditions such as humidity, amount of light and quantity of liquid, and the stability of the biosensor is relatively decreased, which makes commercialization of the biosensor more difficult.

Related prior arts on the above mentioned technology are Korean laid-open patent No. 10-2013-0052528, and Korean laid-open patent No. 10-2015-0079147.

SUMMARY

The present invention is developed to solve the above-mentioned problems of the related arts. The present invention provides a floating gate semiconductor nanostructure biosensor increasing sensing area where the biomolecules react, enhancing the sensitivity, the reproducibility and the stability which are main factors for the commercialization, in the nanostructure FET based biosensor.

In addition, the present invention also provides a method for manufacturing the floating gate semiconductor nanostructure biosensor.

According to an example embodiment, the nanostructure biosensor includes a substrate, an insulating layer, a nanostructure, a source electrode and a drain electrode, a floating gate and a biological sensing material. The insulating layer is formed on the substrate. The nanostructure is protruded from the insulating layer. The source electrode and the drain electrode are formed on the insulating layer and dispose the nanostructure therebetween. The floating gate has a metal pattern or a polysilicon pattern, and extends with contacting the nanostructure. The biological sensing material has a first end combined with an immobile molecule on the floating gate, and a second end combined with a bio molecule.

In an example, the nanostructure biosensor may further include a passivation layer and a liquid gate. The passivation layer may be formed on the source electrode, the drain electrode and the insulating layer. The liquid gate may be formed on the floating gate or formed in a same plane with the floating gate, and may be configured to be functioned as a reference electrode for uniformly maintaining a voltage of a sample solution or configured to apply the voltage to the sample solution.

In an example, the passivation layer may not be formed on the floating gate, and thus the floating gate may be partially exposed to outside.

In an example, the substrate may be a conductive substrate or an insulating substrate. The substrate may be configured to be a lower electrode when the substrate is the conductive substrate.

In an example, the nanostructure may have a wire shape.

In an example, the nanostructure may be a P-type channel or an N-type channel.

In an example, the nanostructure may be one selected from a group having ZnO, GaN, SiC, SnO$_2$, GaP, BN, InP, Si$_3$N$_4$, Si and a mixture thereof.

In an example, the floating gate may further include a first end making contact with the nanostructure, a second end on which the biological sensing material and the immobile molecule, and a connecting portion connecting the first end with the second end.

In an example, the second end may have a width larger than that of the first end. The second end may be a sensing area in which the biomolecule is sensed.

In an example, a gate silicon oxide layer may be formed between the floating gate and the nanostructure.

In an example, conductivity of the nanostructure may be changed as the biological sensing material is combined with the biomolecule. The conductivity of the nanostructure may be restored as the biomolecule is detached from the biological sensing material.

According to an example embodiment, a method for manufacturing a nanostructure biosensor includes forming an insulating layer on a substrate, forming a nanostructure on the insulating layer and forming a source electrode and a drain electrode at both sides of the nanostructure, forming a floating gate, wherein the floating gate has a metal pattern or a polysilicon pattern and extends with contacting the nanostructure, positioning an immobile molecule at an end of the floating gate, and combining and fixing a biological sensing material to the immobile molecule.

In an example, the method may further include forming a passivation layer on the source electrode, the drain electrode and the insulating layer.

In an example, in forming the passivation layer, the passivation layer may be formed after the floating gate is formed, and the passivation layer may be partially etched or patterned, to form an opening through which the floating gate is partially exposed.

In an example, in forming the passivation layer, the passivation layer may be etched or patterned, to form an opening. In forming the floating gate, the floating gate may be formed over the nanostructure through the opening.

In an example, the substrate may be one selected from a group having glass, quartz, silicone, polymer plastic, germanium, metal, oxide and a mixture thereof.

In an example, the insulating layer may include silicon oxide layer, silicon nitride layer, or an insulating thin-film having silicon oxide.

In an example, the nanostructure may be arranged on the insulating layer using Languir-Blodgett (LB) method or flow method, or the nanostructure may be dry or wet etched on the insulating layer using an etching mask.

In an example, the passivation layer may include phosphosilicate, silicon nitride, oxy nitride, photo resist polymer. The passivation layer may be formed via chemical vapor deposition, plasma enhanced chemical vapor deposition, spin coating or spray coating.

According to the present example embodiments, in the floating gate semiconductor nanostructure biosensor, an extending gate having an enlarged sensing surface is used as a floating gate, and thus, the high sensitivity of the semiconductor nanostructure in itself is maintained, and the combination probability between the biomolecule and the nanostructure is increased to enhance the reproducibility, the stability and the characteristics to the reaction time.

In addition, the nanostructure is not directly exposed to a sample solution, and thus the nanostructure may be used as the biosensor.

Here, conduction drift caused by diffusion and penetration of ions inside of the sample solution into the sensor may be improved, compared that the sample solution is directly penetrated into the inside of the nanostructure.

In addition, in the conventional nanostructure biosensor, the nanostructure is mounted on a silicon substrate on which a glass substrate or a silicon oxide film is formed, and thus the biological sensing material is hard to be fixed only on the nanostructure. In contrast, in the present example embodiments, the extending gate structure is used to differentiate the material from the nanostructure or the substrate, and thus self-assembled material selectively attached to the extending gate and the surface treating chemistry are used to selective provide the biological sensing material to the sensing area.

In addition, in the conventional nanostructure biosensor, the insulation on the portions except for the sensing area, is very important for exposing the nanostructure to the sample, but the insulation is harder as the length of the channel decreases. In addition, the source and drain electrodes providing the current and the voltage to the nanostructure are formed under the microchannel through which a fluid flows, and thus the signal interference may be easily caused. In contrast, in the present example embodiment, the extending gate is used for separating the sensing area with the nanostructure spatially, and thus the sensing area may be exposed to the solution more easily. In addition, the interference of the solution with the electrodes may be prevented, so that the stability of the nanostructure sensor may be increased.

In addition, in the conventional nanostructure biosensor, the channel is directly exposed to the solution and the biosensor is operated in the air or the biosensor has characteristics different from those of FET properly insulated by an insulator. In contrast, in the present example embodiment, the extending gate is used, so that the conventional CMOS process architecture is used without change. Thus, in developing and commercializing the biosensor, the conventional simulation tool and the conventional library may be easily used.

BRIEF DESCRIPTION OF THE DRAWINGS

FIG. 9 is a flow chart illustrating a method for manufacturing the biosensor of FIG. 6.

Figure 1:
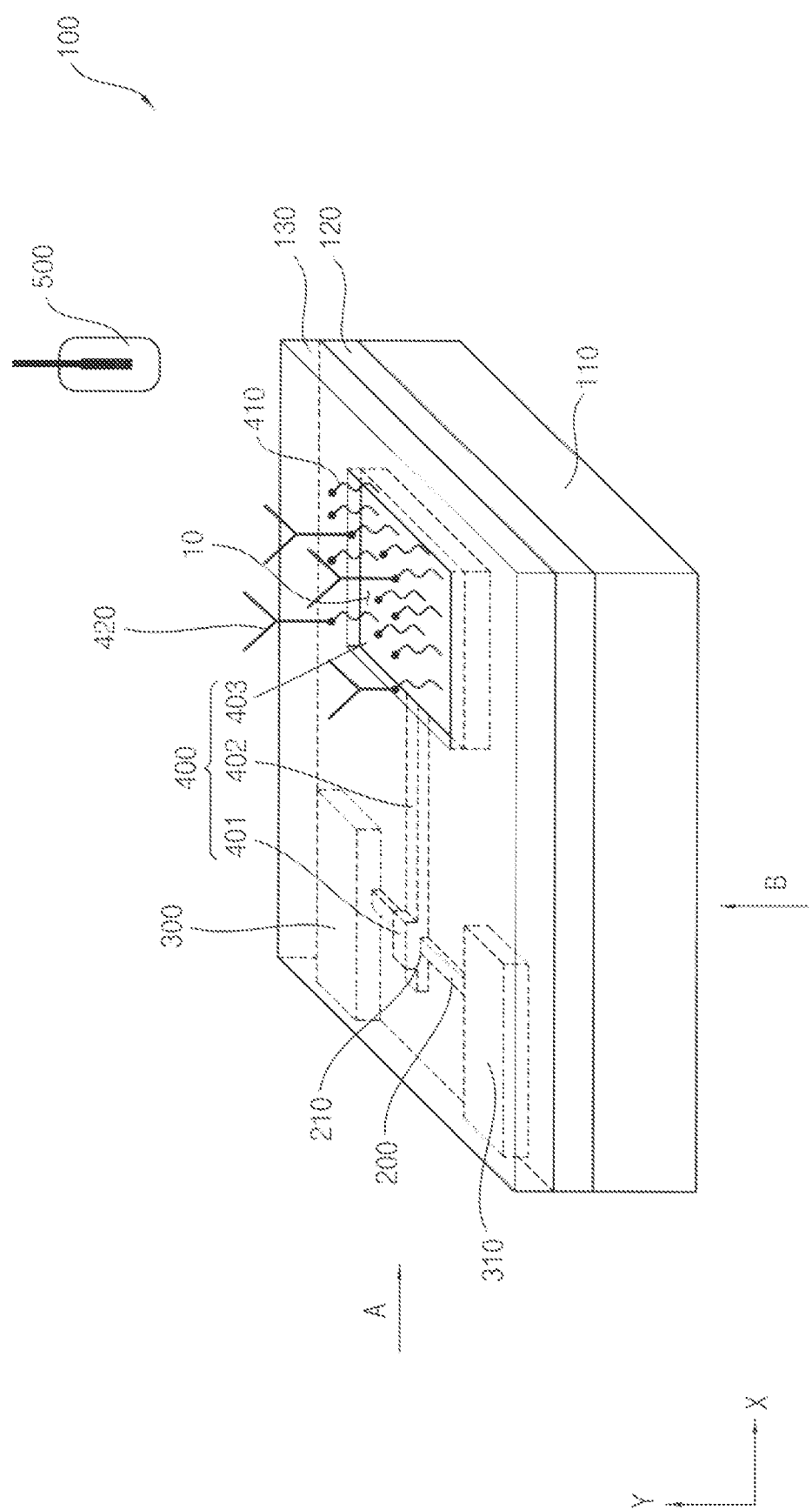
FIG. 1 is a perspective view illustrating the floating gate semiconductor nanostructure biosensor according to an example embodiment of the present invention.

| * Reference numerals | |
|---|---|
| 100: nanostructure biosensor | 110: substrate |
| 120: insulating layer | 130: passivation layer |
| 200: nanostructure | 210: gate silicon oxide layer |
| 300: source electrode | 310: drain electrode |
| 400: floating gate | 401: first end |
| 402: connecting portion | 403: second end |
| 410: immobile molecule | 420: biological sensing material |
| 500: liquid gate | |

DETAILED DESCRIPTION

The invention is described more fully hereinafter with Reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention is described more fully hereinafter with reference to the accompanying drawings, in which embodiments of the invention are shown.

Figure 2:
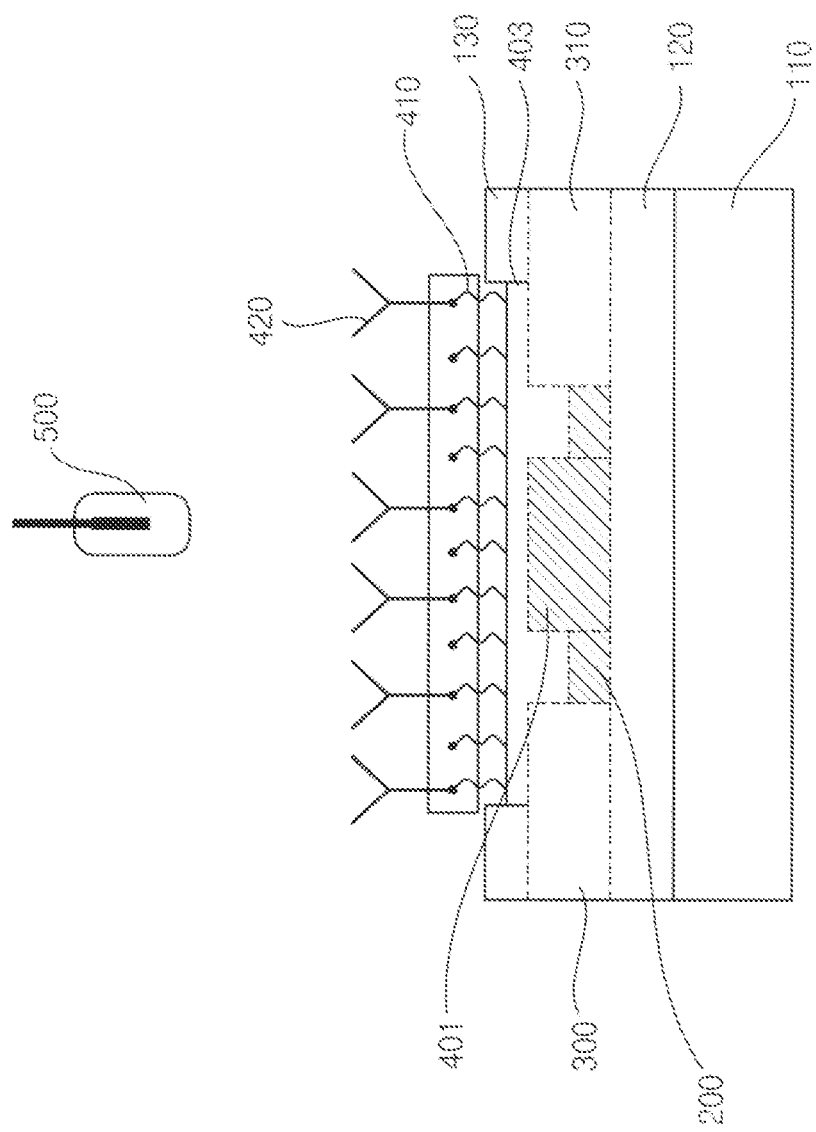
FIG. 2 is a side view illustrating the biosensor of FIG. 1 along an A direction.

FIG. 1 is a perspective view illustrating the floating gate semiconductor nanostructure biosensor according to an example embodiment of the present invention, and FIG. 2 is a side view illustrating the biosensor of FIG. 1 along an A direction.

Referring to FIGS. 1 and 2, the nanostructure biosensor 100 (hereinafter, biosensor) according to the present example embodiment includes a substrate 110, an insulating layer 120, a passivation layer 130, a nanostructure 200, a source electrode 300, a drain electrode 310, a floating gate 400, an immobile molecule 410, a biological sensing material 420 and a liquid gate 500.

Here, as illustrated in FIG. 1, the substrate 110 may be one selected from a group having glass, quartz, silicone, polymer plastic, germanium, metal, oxide and a mixture thereof. The substrate 110 may be an insulating substrate or a conductive substrate, and may be functioned as a lower electrode when the substrate 110 is the conductive substrate.

The insulating layer 120 is formed on the substrate 110. The insulating layer 120 may include oxide or nitride based material such as a silicon oxide layer or a silicon nitride layer, to prevent the source electrode 300 and the drain electrode 310 from being electrically connected to the floating gate 400.

For example, the silicon oxide layer may be high density plasma (HDP) layer, boron phosphorus silicate glass (BPSG) layer, phosphorus silicate glass (PSG) layer, plasma enhanced tetraethylosilicate (PETEOS) layer, un-doped silicate glass (USG) layer, fluorinated silicate glass (FSG) layer, carbon doped oxide (CDO) layer and organic silicate glass (OSG) layer.

In addition, the insulating layer 120 may include at least one selected from a group including a metal oxide like $Al_2O_3$, $HFO_2$, an organic layer like self-assembled monolayer (SAM), and a photoresist.

The insulating layer 120 may include an insulating thin-film having silicon oxide, a photoresist, or an insulating thin-film except for the photoresist. In addition, the insulating layer and the nanostructure may be formed using a silicon-on-insulator substrate having an insulator and a structural layer.

The nanostructure 200 functioned as the semiconductor is protruded from the insulating layer 120. The nanostructure 200 may be arranged on the insulating layer 120 using Languir-Blodgett (LB) method or flow method.

The nanostructure 200 may be etched on the insulating layer, using an etching mask. In addition, the etching of the nanostructure 200 may be formed with a dry etching or a wet etching.

The nanostructure 200 may have a wire shape, and the shape of the nanostructure 200 may be changed variously.

For example, the nanostructure 200 may be a nano wire shape as illustrated in the figure.

The nanostructure 200 has a diameter or a thickness with a nano scale, for example, the nanostructure 200 may be a structure with the diameter or the thickness of several nano meters or dozens of nano meters.

The nanostructure 200 may be one selected from a group having ZnO, GaN, SiC, $SnO_2$, GaP, BN, InP, $Si_3N_4$, Si and a mixture thereof.

The nanostructure 200 may include a core, and at least one shell covering the core.

The nanostructure 200 may be formed as a P-type channel or an N-type based on impurities.

Referring to FIG. 1, the nanostructure 200 has a cuboid shape extending along a second direction Y. The nanostructure 200 is disposed between the source electrode 300 and the drain electrode 310.

The source electrode 300 is formed on the insulating layer 120 and is disposed at a first side of the extending direction of the nanostructure 200. The drain electrode 310 is formed on the insulating layer 120 and is disposed at a second side of the extending direction of the nanostructure 200.

The source electrode 300 and the drain electrode 310 face each other, with disposing the nanostructure 200 therebetween.

Each of the source and drain electrodes 300 and 310 has predetermined width, length and thickness, as illustrated in FIG. 1.

For example, electrode shapes of the source and drain electrodes 300 and 310 are formed via photolithography, Pd/Au layer is formed via thermal deposition and then lift-off process is used for finally forming the source and drain electrodes 300 and 310.

The floating gate 400 includes a metal or a polysilicon pattern, and is formed on the insulating layer 120. The floating gate 400 is disposed between the source electrode 300 and the drain electrode 310, and the floating gate 400 is spaced apart from both of the source and drain electrodes 300 and 310.

In the present example embodiment, as illustrated in FIG. 1, the floating gate 400 is disposed between the source electrode 300 and the drain electrode 310, and extends with making contact with a surface of the nanostructure 200.

A width of the surface of the nanostructure 200 making contact with the floating gate 400 may be a micro or nano size. A gate silicon oxide layer 210 having relatively thin thickness may be further formed between the floating gate 400 and the nanostructure 200.

In FIG. 1, the floating gate 400 extends along a first direction X substantially perpendicular to the second direction Y, and thus, the extending direction of the floating gate 400 is substantially perpendicular to the extending direction of the nanostructure 200.

Alternatively, the extending direction of the floating gate 400 may be variously changed, based on the positon between the nanostructure 200 and a second end 403.

The floating gate 400 includes a first end 401, a connecting portion 402 and a second end 403.

Figure 3:
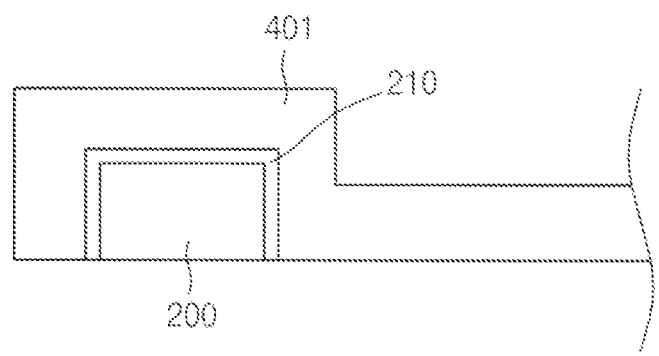
FIG. 3 is a cross-sectional view of a first end covering the nanostructure in the biosensor of FIG. 1.

FIG. 3 is a cross-sectional view of a first end covering the nanostructure in the biosensor of FIG. 1.

Referring to FIG. 3, the first end 401 may cover three side surfaces of the nanostructure 200 having the cuboid shape (when a cross-sectional shape of the nanostructure along the first direction is a rectangular shape).

In addition, although not shown in the figure, when the nanostructure 200 has a cubic shape, the first end 401 may cover all surfaces of the nanostructure 200 except for a bottom surface of the nanostructure 200.

Referring to FIGS. 1 and 2 again, the second end 403 may have a width larger than that of the first end 401 covering the surface of the nanostructure 200.

The immobile molecule 410 fixing the biological sensing material 420 is positioned at the second end 403. Here, the biological sensing material 420 is a biological active material. The biological sensing material 420 is immobilized by the immobile molecule 410, and thus the second end 403 is a sensing area where biological reaction occurs.

The second end 403 is a portion of the floating gate 400, and thus any biological active material may be immobilized at any position of the floating gate 400.

In the present example embodiment, the biological sensing material 420 like an antibody, is immobilized at the immobile molecule 410, for the biological reaction which is the key function of the biosensor.

The second end 403 senses the biomolecules, and the second end 403 may include the material having the electrical characteristics changed by an external electric field.

For example, the second end 403 may include crystalline silicon non-crystalline silicon, a doping layer doped with impurities, a semiconductor layer, an oxide layer, a compound layer, a CNT, or a semiconductor nanowire. In addition, the second end 403 may be a nano size to increase the sensitivity of the biosensor 100.

A first end of the biological sensing material 420 is fixed to the second end 403, using the immobile molecule 410 which is an intervening medium molecule. A second end of the biological sensing material 420 is combined with the biomolecule having specific temperament.

For example, the biological sensing material 420 may be a protein molecule, nucleic acid, an organic molecule, an inorganic molecule, an oxide or a metal oxide.

The protein molecule may be any kinds of biomolecules like an antibody, an antigen, a substrate protein, an enzyme or a coenzyme.

The nucleic acid may be one of DNA, RNA, PNA, LNA or a mixture or a hybrid thereof.

In addition, the surface of the second end 403 is treated such that the immobile molecule 410 fixes the biological sensing material 420 more hard. For example, a functional group may be induced on the surface of the second end 403, to fix the biological sensing material 420 on the surface of the second end more hard.

For example, the functional group may include carbonyl, carboxylic, amine, imine, epoxy, nitro, hydroxyl, phenyl, nitryl, thiol or silane.

The connecting portion 402 extended from the first end 401, connects the first end 401 with the second end 403.

The passivation layer 130 is coated on the source electrode 300, the drain electrode 310 and the insulating layer 120, as illustrated in FIGS. 1 and 2.

The passivation layer 130 may include phosphosilicate, silicon nitride, oxy nitride, photo resist polymer, and may be formed via chemical vapor deposition, plasma enhanced chemical vapor deposition, spin coating or spray coating.

The thickness of the passivation layer 130 is not limited, and may be selected variously. For example, the thickness of the passivation layer 130 may be between about 5 nm and about 50 μm, between about 10 nm and about 30 μm, or between about 15 nm and about 20 μm.

In addition, the thickness of the passivation layer 130 may be measured by the conventional measurement device.

The shape of the passivation layer 130 is not limited and may be formed variously.

For example, the passivation layer 130 may be entirely formed over the substrate 110, or may be partially formed at the substrate.

The passivation layer 130 is partially etched or patterned to form an opening 10 through which the floating gate 400 is exposed. Here, the second end 403 of the floating gate 400 is exposed outside through the opening 10.

Alternatively, as explained below referring to FIG. 6, the passivation layer 130 is etched to form the floating gate 400 on the nanostructure 200. Here, the passivation layer 130 is etched to form an opening 20, and then the floating gate 400 is formed. The floating gate 400 is formed on the nanostructure 200, through the opening 20.

A sample solution including the biomolecules which are to be detected, is provided on the surface of the second end 403.

Here, the biomolecules in the sample solution, includes probe molecules and non-specific molecules. The sample solution may include a body fluid such as a blood, a blood plasma, a blood serum, an interstitial fluid, a lavage, perspiration, salvia, urine and so on.

The liquid gate 500 is formed over the floating gate 400, or is formed at the same plane as the floating gate 400. The liquid gate 500 is functioned as a reference electrode for uniformly maintaining the voltage of the solution. In addition, the liquid gate 500 applies the voltage to the liquid, to control the electric transfer characteristics of the biosensor 100 or the sensitivity of the biosensor 100.

The biological sensing material 420 is combined with the biomolecules in the sample solution. The biomolecule has an electrical charge, and thus, as the biomolecule is combined with the biological sensing material 420, the amount of the current flowing in the nanostructure 200 may be changed when the voltage is applied to the source and drain electrodes 300 and 310.

As the density of the electrical charge of the surface of the biological sensing material 420 immobilized on the surface of the second end 403 is changed, the change of the electrical charge applied to the floating gate is measured.

For example, when the biological sensing material 420 is combined with the biomolecule, the surface energy of the floating gate 400 is changed due to the electrical charge in the biomolecule. Then, the surface energy is transferred to the nanostructure 200, and thus the internal energy and the conductivity of the nanostructure 200 are also changed.

In contrast, as the biomolecule is detached from the biological sensing material 420, the internal energy and the conductivity of the nanostructure 200 are restored.

Accordingly, the change of the conductivity of the nanostructure 200 due to the biomolecule is measured, to quantify concentration of the biomolecule in the sample solution.

Figure 4A:
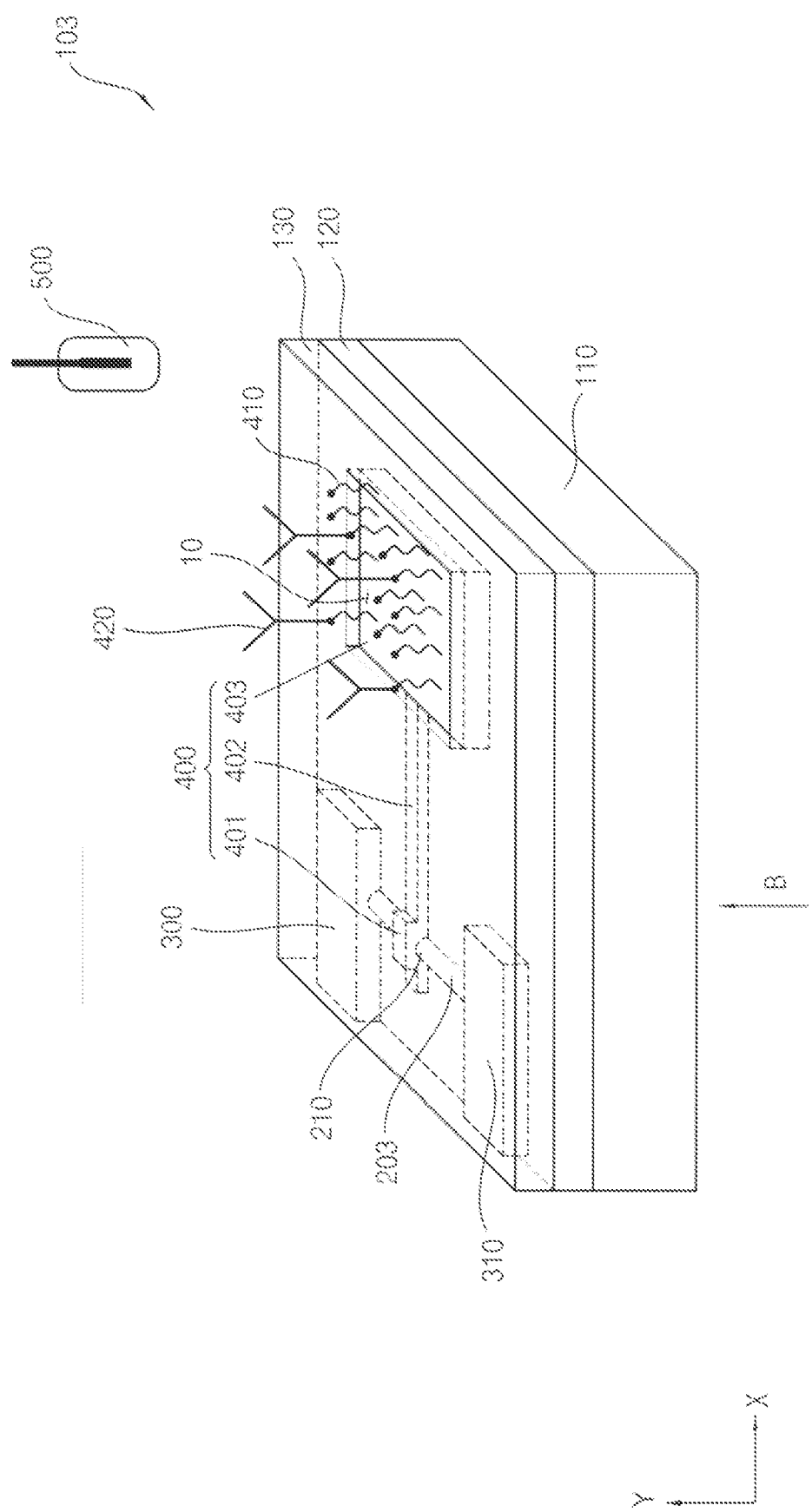
FIG. 4A is a perspective view illustrating the floating gate semiconductor nanostructure biosensor according to another example embodiment of the present invention.
Figure 4B:
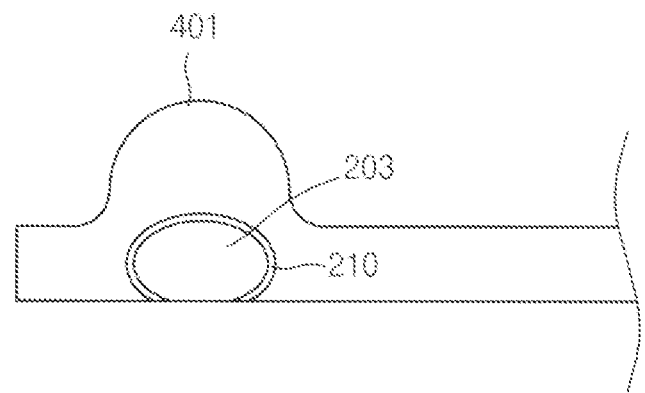
FIG. 4B is a cross-sectional view of a first end covering the nanostructure in the biosensor of FIG. 4A.
Figure 5A:
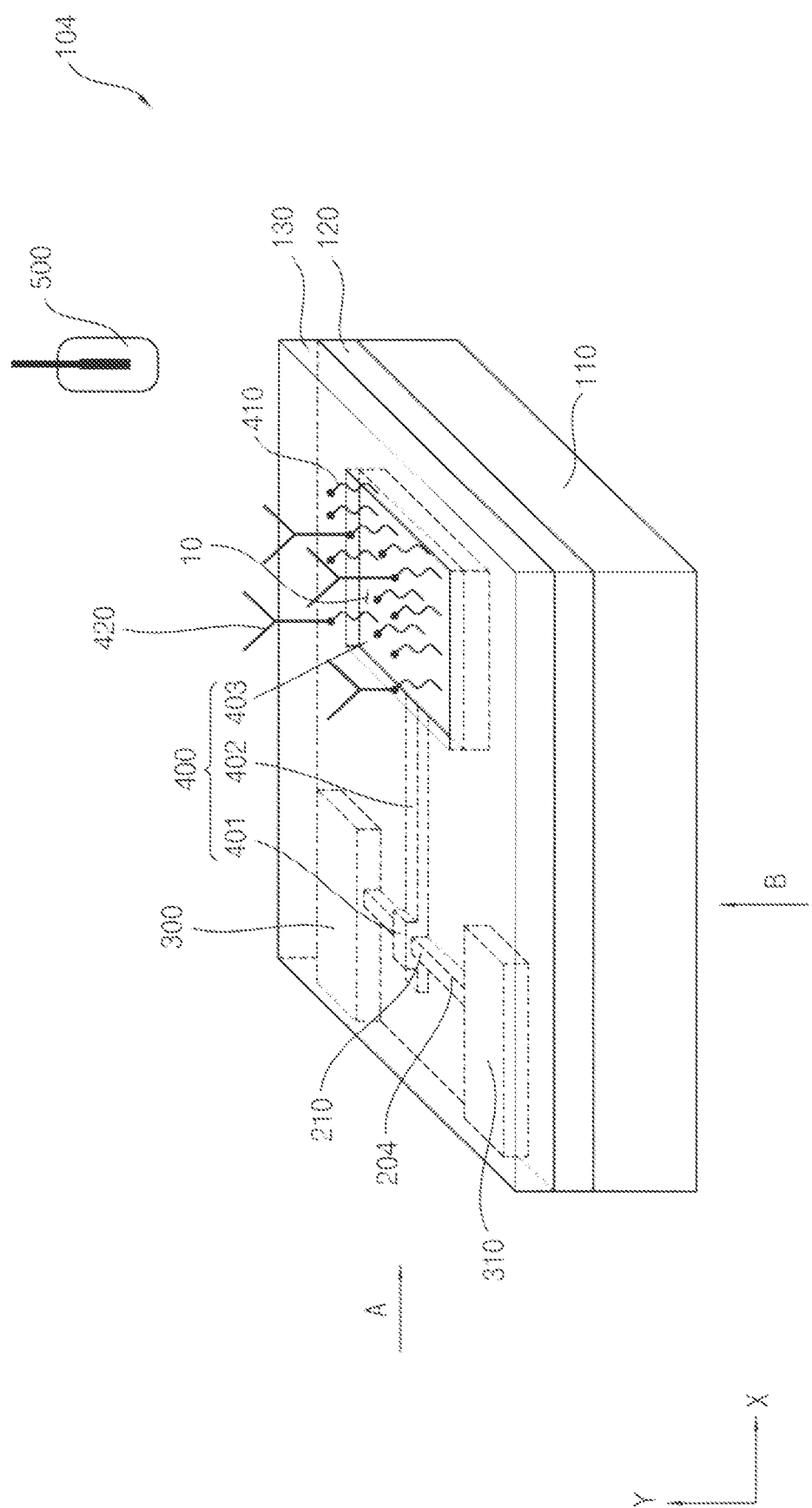
FIG. 5A is a perspective view illustrating the floating gate semiconductor nanostructure biosensor according to still another example embodiment of the present invention.
Figure 5B:
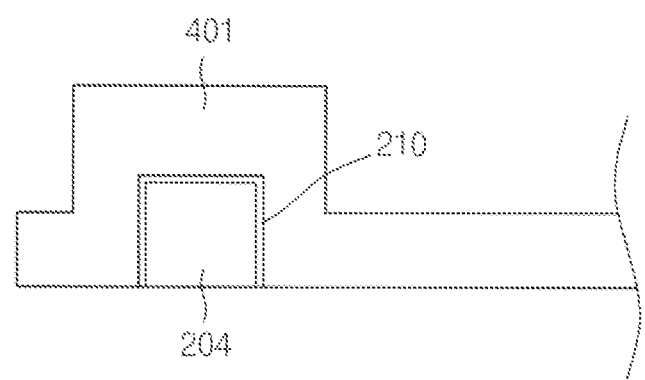
FIG. 5B is a cross-sectional view of a first end covering the nanostructure in the biosensor of FIG. 5A.

FIG. 4A is a perspective view illustrating the floating gate semiconductor nanostructure biosensor according to another example embodiment of the present invention. FIG. 4B is a cross-sectional view of a first end covering the nanostructure in the biosensor of FIG. 4A. FIG. 5A is a perspective view illustrating the floating gate semiconductor nanostructure biosensor according to still another example embodiment of the present invention. FIG. 5B is a cross-sectional view of a first end covering the nanostructure in the biosensor of FIG. 5A.

The biosensors 103 and 104 according to the present example embodiment are substantially same as the biosensor 100 according to the previous example embodiment in FIGS. 1 and 2, except for the shape of the nanostructure 200, and thus same reference numerals are used for same elements and any further repetitive explanation will be omitted.

Referring to FIGS. 4A to 5B, the nanostructure 200, 203 and 204 may be formed by being etched on the insulating layer 120 using the etching mask, or by the chemical deposition, as explained before. The nanostructure 200, 203 and 204 may have the wire shape in a whole. In addition, when viewed along a B direction, the nanostructure may have a rectangular shape as illustrated in FIG. 1, may have a circular shape as illustrated in FIGS. 4A and 4B, may have a square shape as illustrated in FIGS. 5A and 5B, and further may have various kinds of shapes such as a triangular shape or a trapezoidal shape.

Figure 6:
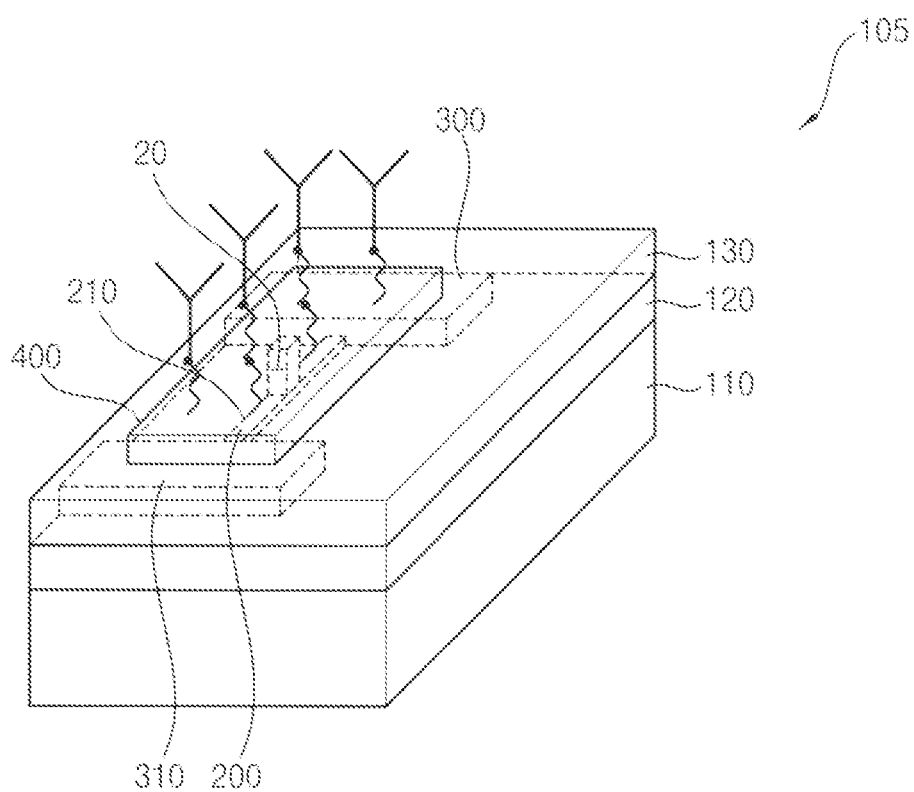
FIG. 6 is a perspective view illustrating the floating gate semiconductor nanostructure biosensor according to still another example embodiment of the present invention.

FIG. 6 is a perspective view illustrating the floating gate semiconductor nanostructure biosensor according to still another example embodiment of the present invention.

The biosensor 105 according to the present example embodiment is substantially same as the biosensors 100, 103 and 104 according the previous example embodiment in FIGS. 1 to 5B, except for the passivation layer, and thus same reference numerals are used for same elements and any further repetitive explanation will be omitted.

Referring to FIG. 6, the passivation layer 130 is etched to form the opening 20. Here, the opening 20 connects the floating gate 400 with the nanostructure 200. The floating gate 400 is disposed on the nanostructure 200, and the passivation layer 130 is disposed between the floating gate 400 and the nanostructure 200.

Figure 7:
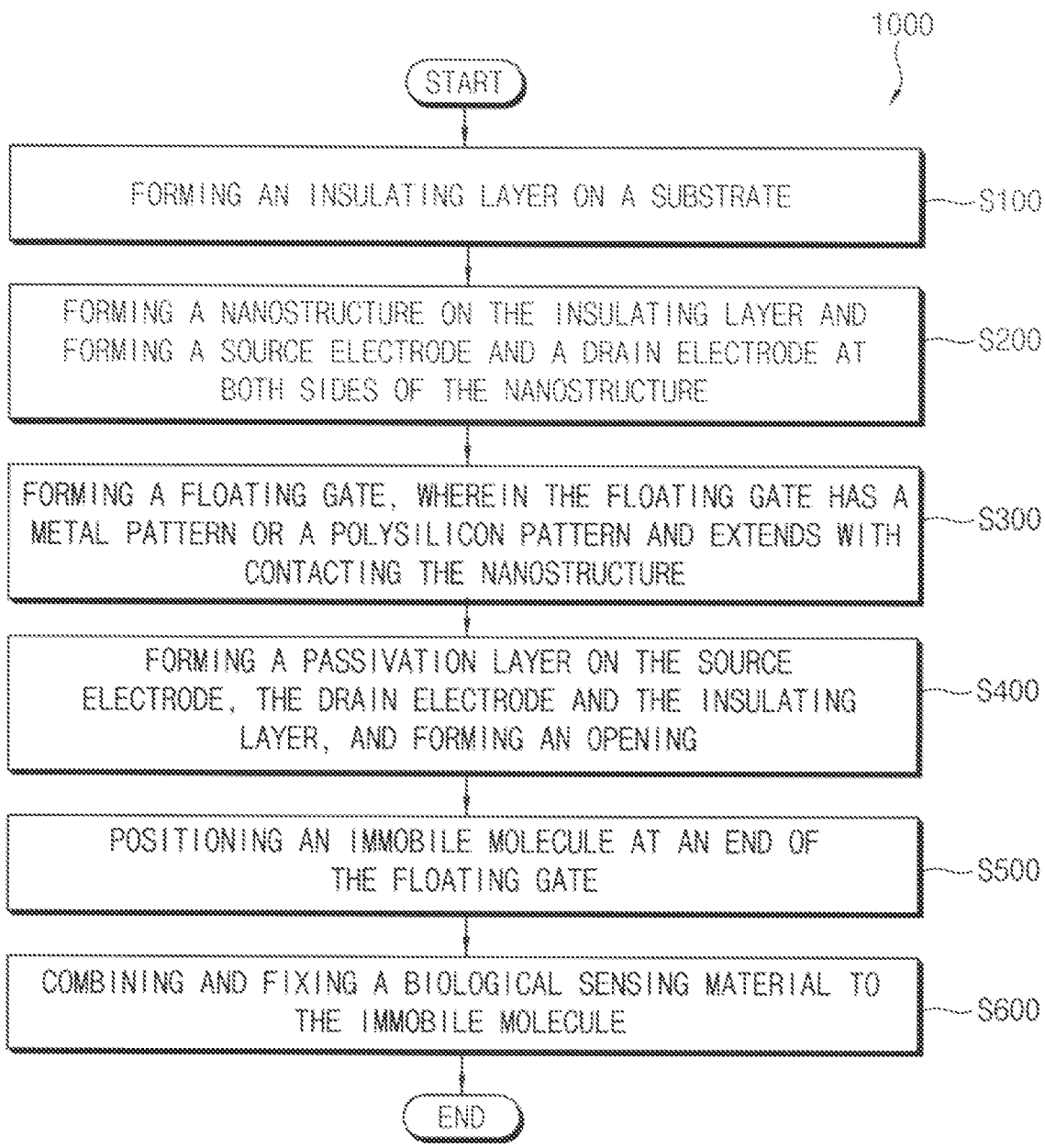
FIG. 7 is a flow chart illustrating a method for manufacturing the biosensor of FIG. 1.

FIG. 7 is a flow chart illustrating a method for manufacturing the biosensor of FIG. 1. FIGS. 8A to 8F are processing views illustrating the method of FIG. 7.

Figure 8A:
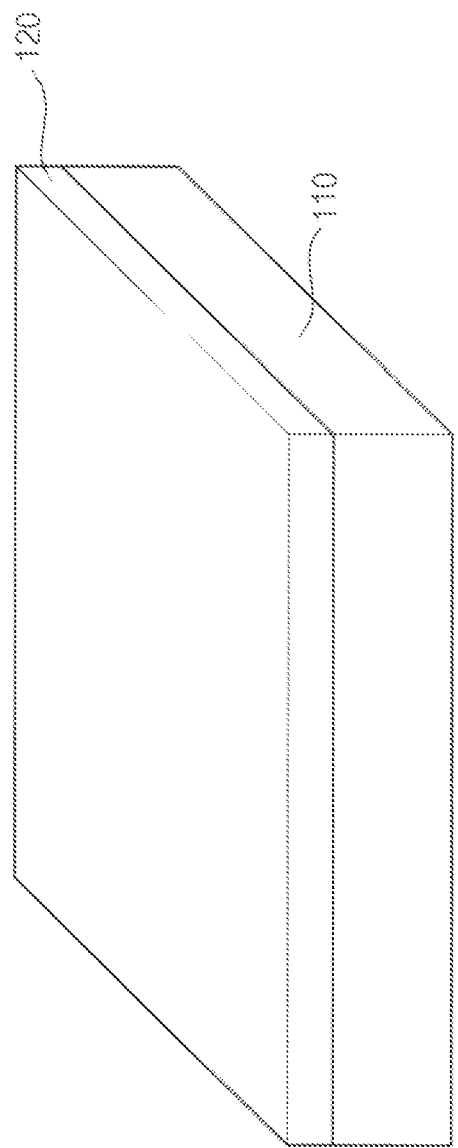
FIGS. 8A to 8F are processing views illustrating the method of FIG. 7.

Referring to FIGS. 7 and 8A, in the method, the insulating layer 120 is formed on the substrate 100 (step S100).

The substrate 110 may be one selected from a group having glass, quartz, silicone, polymer plastic, germanium, metal, oxide and a mixture thereof. The substrate 110 may be an insulating substrate or a conductive substrate.

The insulating layer 120 may include oxide or nitride based material such as a silicon oxide layer or a silicon nitride layer, to prevent the source electrode 300 and the drain electrode 310 from being electrically connected to the floating gate 400.

The insulating layer 120 may include an insulating thin-film having silicon oxide, a photoresist, or an insulating thin-film except for the photoresist. In addition, the insulating layer and the nanostructure may be formed using a silicon-on-insulator substrate having an insulator and a structural layer.

Figure 8B:
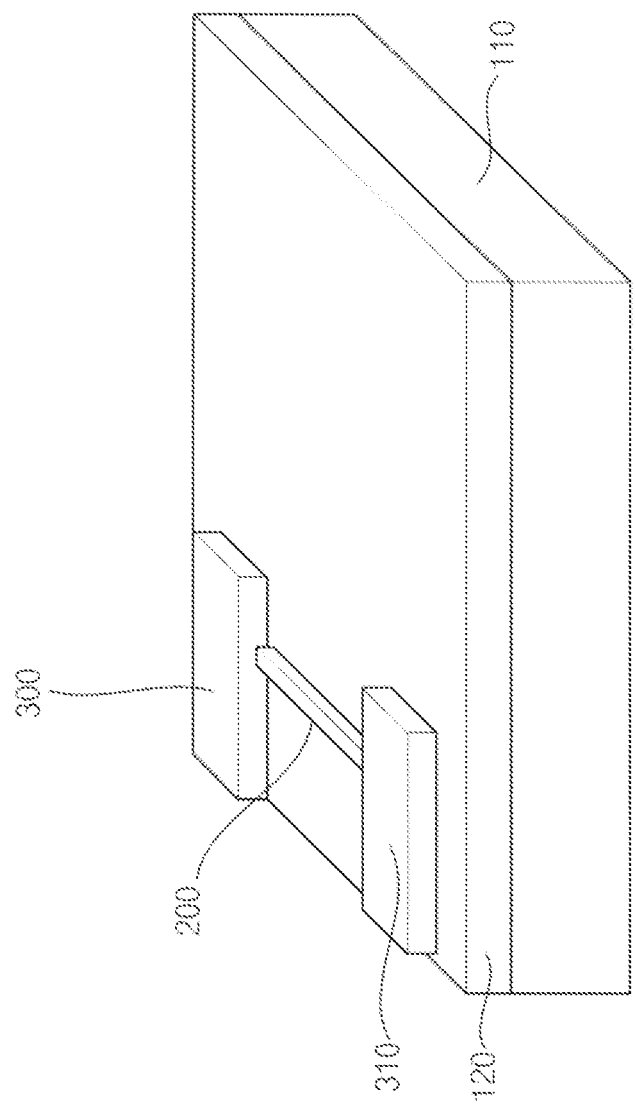

Then, referring to FIG. 8B, the nanostructure 200 is formed to be protruded through the insulating layer 120, and the source electrode 300 and the drain electrode 310 are formed at both sides of the nanostructure 200 (step S200).

The nanostructure 200 may be formed on the insulating layer 120, using languir-blodgett (LB) method or a flow method. The nanostructure 200 is etched on the insulating layer 120 using the etching mask, and here, the etching of the nanostructure 200 may be formed via the wet etching or the dry etching.

The source electrode 300 is disposed at a first side of the nanostructure 200, and the drain electrode 310 is disposed at a second side of the nanostructure 200. Here, the source and drain electrodes 300 and 310 are formed on the insulating layer 120.

Here, each of the source and drain electrodes 300 and 310 has a predetermined width, length and thickness.

For example, electrode shapes of the source and drain electrodes 300 and 310 are formed via photolithography, Pd/Au layer is formed via thermal deposition and then lift-off process is used for finally forming the source and drain electrodes 300 and 310.

Figure 8C:
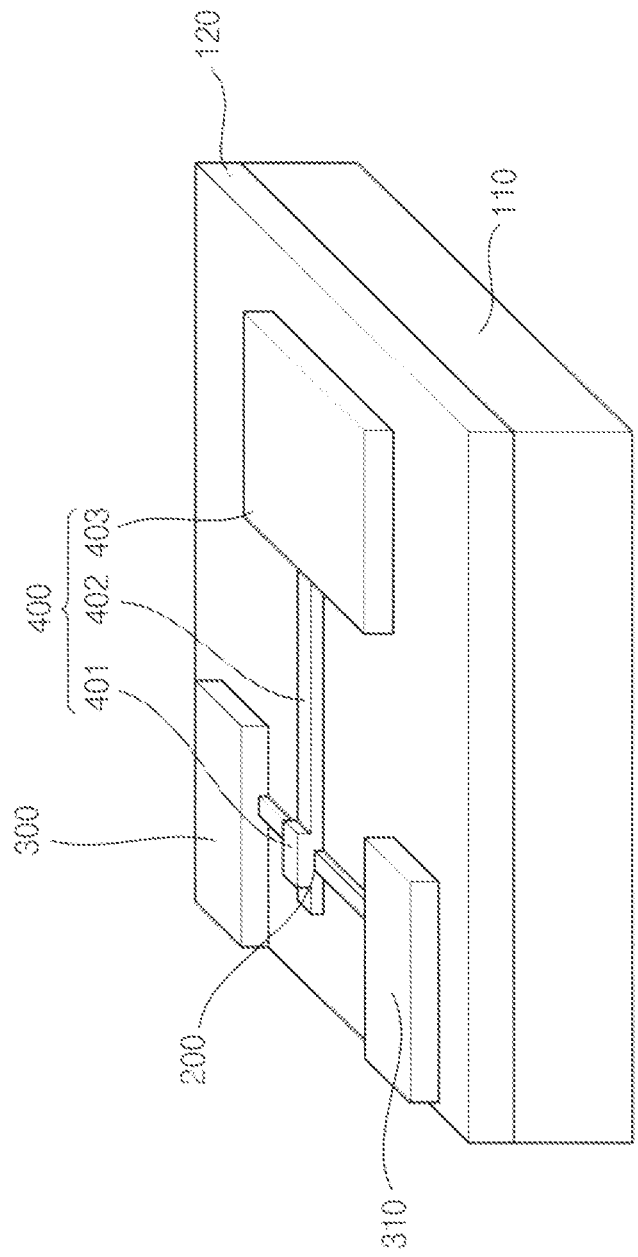

Referring to FIGS. 7 and 8C, the floating gate 400 is formed. The floating gate 400 includes a metal or a poly-silicon pattern, and extends between the source electrode 300 and the drain electrode 310 on the insulating layer 120. The floating gate 400 partially makes contact with the surface of the nanostructure 200 (step S300).

Figure 8D:
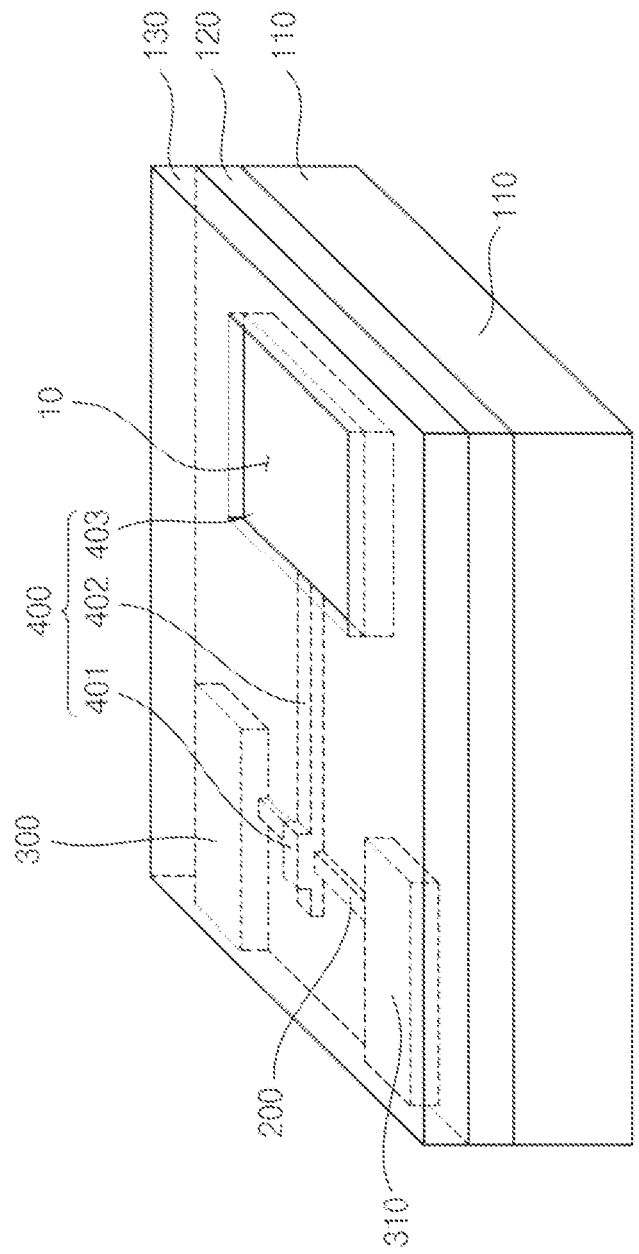

Then, referring to FIGS. 7 and 8D, the passivation layer 130 is coated on the source electrode 300, the drain electrode 310 and the insulating layer 120 (step S400).

The passivation layer includes phosphosilicate, silicon nitride, oxy nitride, photo resist polymer, and is formed via chemical vapor deposition, plasma enhanced chemical vapor deposition, spin coating or spray coating.

The floating gate 400 includes the first end 401 making contact with the surface of the nanostructure 200, the second end 402 at which the biological sensing material 420 and the immobile molecule 410 are positioned, and the connecting portion 402 extending from the first end 401 to connect the first end 401 with the second end 403.

Then, the passivation layer 130 is etched or patterned, to form the opening 10 exposing the second end 403, which is the portion of the floating gate 400.

Figure 8E:
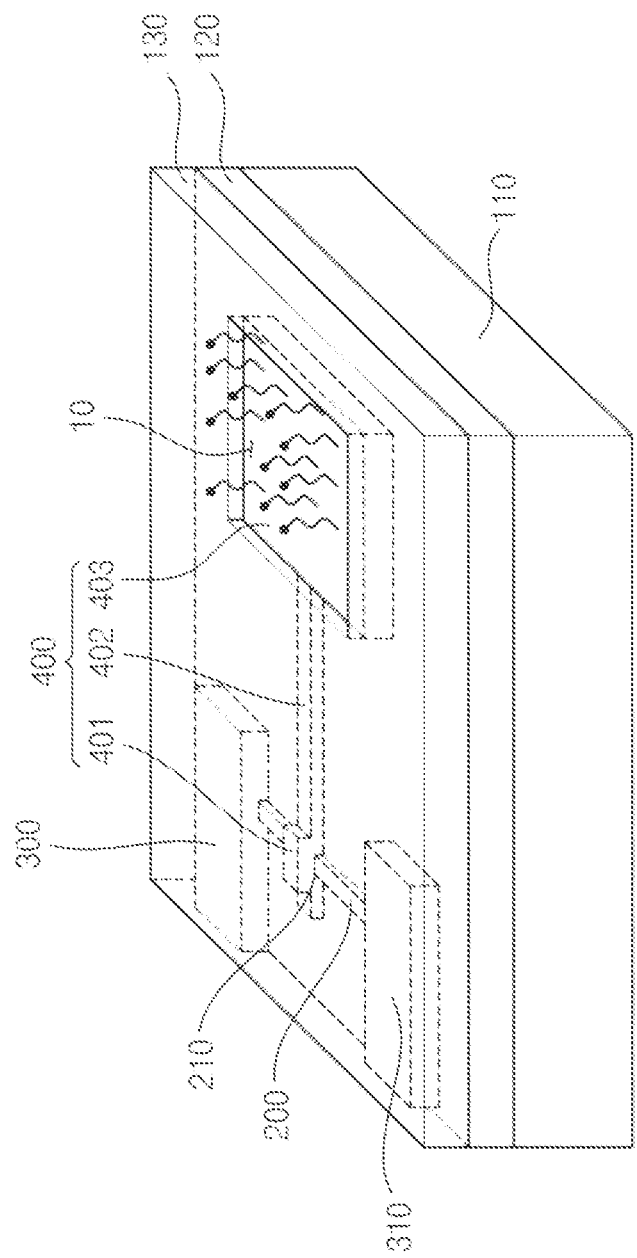

Then, referring to FIGS. 7 and 8E, the immobile molecule 410 is positioned on the second end 403 which is an end of the floating gate 400. The immobile molecule 410 fixes the biological sensing material 420 which is a biological active material.

Figure 8F:
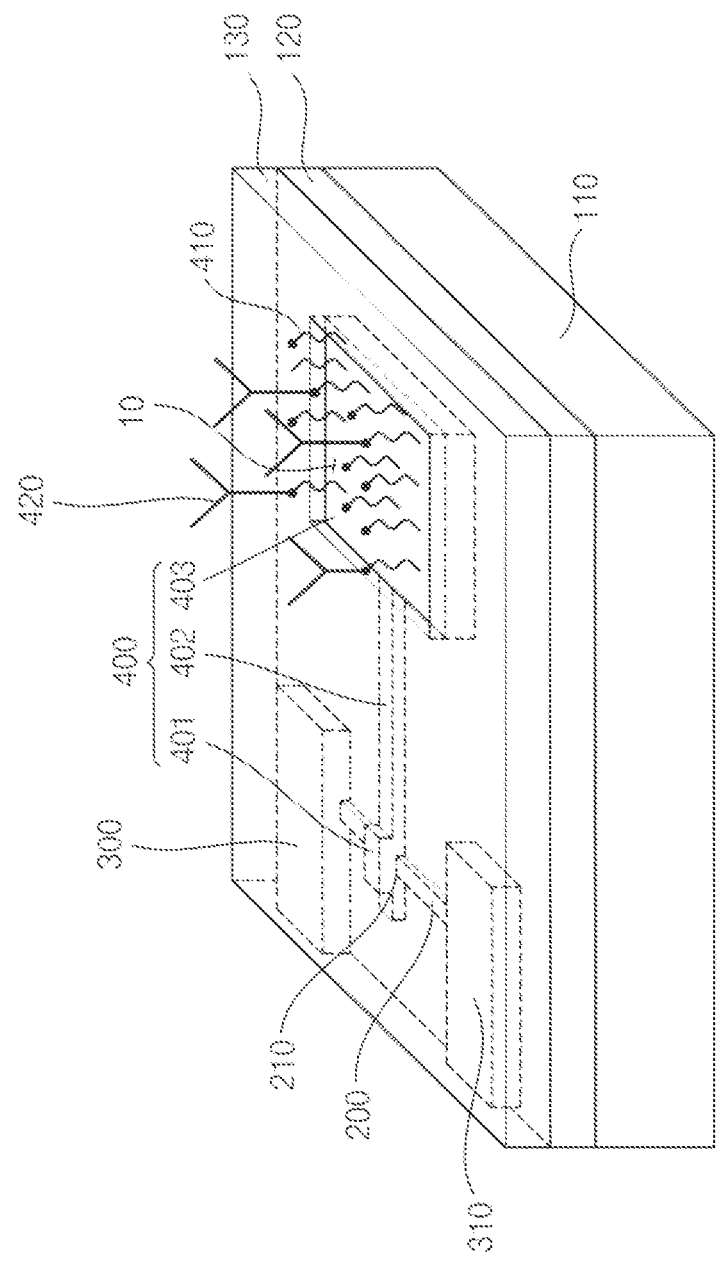

Finally, referring to FIG. 8F, the biological sensing material 420 is immobilized by the immobile molecule 410 (step S600), and thus, the second end 403 is to be the sensing area where the biological reaction occurs due to the biological sensing material 420.

The liquid gate 500, as explained referring to FIG. 1, is formed over or as the same plane with the floating gate 400, and functions as the reference electrode for uniformly maintaining the voltage of the solution or functions to apply additional voltage for controlling the sensitivity of the biosensor.

Here, the biological sensing material 420 is combined with the biomolecule provided from outside, and then the biomolecule is sensed in the floating gate 400.

Figure 10:
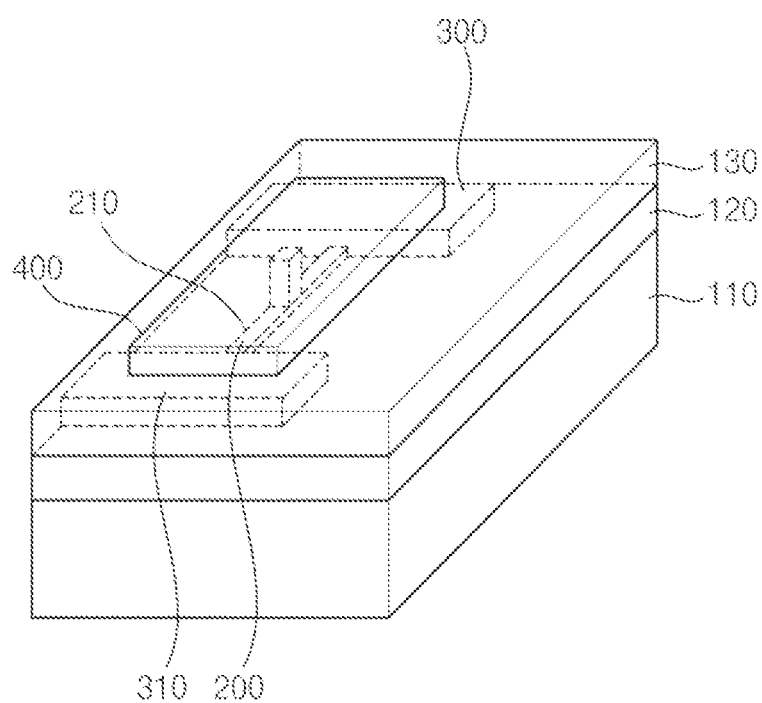
FIG. 10 is a flow chart illustrating a method for manufacturing the biosensor of FIG. 9.

FIG. 9 is a flow chart illustrating a method for manufacturing the biosensor of FIG. 6. FIG. 10 is a flow chart illustrating a method for manufacturing the biosensor of FIG. 9.

The method according to the present example embodiment is substantially same as the method according to the previous example embodiment in FIGS. 6, and 7A to 7F, except for forming the passivation layer and the floating gate, and thus same reference numerals are used for same elements and any further repetitive explanation will be omitted.

Referring to FIGS. 9 and 10, the passivation layer 130 is coated on the source electrode 300, the drain electrode 310 and the insulating layer 120 (step S300), and then the passivation layer 130 is etched to form the opening 20. Then, the floating gate 400 is formed on the nanostructure 200 through the opening 20, so that the floating gate 400 makes contact with the surface of the nanostructure 200 and extends along the nanostructure 200 (step S400).

According to the present example embodiments, in the floating gate semiconductor nanostructure biosensor, an extending gate having an enlarged sensing surface is used as a floating gate, and thus, the high sensitivity of the semiconductor nanostructure in itself is maintained, and the combination probability between the biomolecule and the nanostructure is increased to enhance the reproducibility, the stability and the characteristics to the reaction time.

In addition, the nanostructure is not directly exposed to a sample solution, and thus the nanostructure may be used as the biosensor.

Here, conduction drift caused by diffusion and penetration of ions inside of the sample solution into the sensor may be improved, compared that the sample solution is directly penetrated into the inside of the nanostructure.

In addition, in the conventional nanostructure biosensor, the nanostructure is mounted on a silicon substrate on which a glass substrate or a silicon oxide film is formed, and thus the biological sensing material is hard to be fixed only on the nanostructure. In contrast, in the present example embodiments, the extending gate structure is used to differentiate the material from the nanostructure or the substrate, and thus self-assembled material selectively attached to the extending gate and the surface treating chemistry are used to selective provide the biological sensing material to the sensing area.

In addition, in the conventional nanostructure biosensor, the insulation on the portions except for the sensing area, is very important for exposing the nanostructure to the sample, but the insulation is harder as the length of the channel decreases. In addition, the source and drain electrodes providing the current and the voltage to the nanostructure are formed under the microchannel through which a fluid flows, and thus the signal interference may be easily caused. In contrast, in the present example embodiment, the extending gate is used for separating the sensing area with the nanostructure spatially, and thus the sensing area may be exposed to the solution more easily. In addition, the interference of the solution with the electrodes may be prevented, so that the stability of the nanostructure sensor may be increased.

In addition, in the conventional nanostructure biosensor, the channel is directly exposed to the solution and the biosensor is operated in the air or the biosensor has characteristics different from those of FET properly insulated by an insulator. In contrast, in the present example embodiment, the extending gate is used, so that the conventional CMOS process architecture is used without change. Thus, in developing and commercializing the biosensor, the conventional simulation tool and the conventional library may be easily used.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a nanostructure biosensor, the method comprising:
    forming an insulating layer on a substrate;
    forming a nanostructure on the insulating layer and forming a source electrode and a drain electrode at both sides of the nanostructure;
    forming a floating gate, wherein the floating gate has a metal pattern or a polysilicon pattern and extends with contacting the nanostructure;
    forming a passivation layer on the source electrode, the drain electrode and the insulating layer;
    wherein in forming the passivation layer, the passivation layer is etched and patterned, to form an opening, wherein in forming the floating gate, the floating gate is formed over the nanostructure through the opening;
    positioning an immobile molecule at an end of the floating gate; and
    combining and fixing a biological sensing material to the immobile molecule.

2. The method of claim 1, wherein the substrate is one selected from a group having glass, quartz, silicone, polymer plastic, germanium, metal, oxide and a mixture thereof.

3. The method of claim 1, wherein the insulating layer comprises silicon oxide layer, silicon nitride layer, or an insulating thin-film having silicon oxide.

4. The method of claim 1, wherein the nanostructure is arranged on the insulating layer using Languir-Blodgett (LB) method or flow method, or the nanostructure is dry or wet etched on the insulating layer using an etching mask.

5. The method of claim 1, wherein the passivation layer comprises phosphosilicate, silicon nitride, oxy nitride, photo resist polymer, wherein the passivation layer is formed via chemical vapor deposition, plasma enhanced chemical vapor deposition, spin coating or spray coating.

* * * * *